United States Patent [19]

Bates

[11] Patent Number: 4,857,935
[45] Date of Patent: Aug. 15, 1989

[54] RF CIRCUIT ARRANGEMENT

[75] Inventor: Robert N. Bates, Crawley, United Kingdom

[73] Assignee: U.S. Philips Corporation, New York, N.Y.

[21] Appl. No.: 117,350

[22] Filed: Oct. 27, 1987

Related U.S. Application Data

[63] Continuation of Ser. No. 911,589, Sep. 25, 1986, abandoned.

[30] Foreign Application Priority Data

Sep. 27, 1985 [GB] United Kingdom ............... 8523866

[51] Int. Cl.$^4$ .......................... G01S 13/32; H03F 3/60
[52] U.S. Cl. ................................... 342/128; 342/122; 342/175; 342/200; 330/54; 330/277; 330/286
[58] Field of Search ............... 330/54, 277, 286, 342

[56] References Cited

U.S. PATENT DOCUMENTS

| | | | |
|---|---|---|---|
| 4,486,719 | 12/1984 | Ayasli | 330/286 |
| 4,543,535 | 9/1985 | Ayasli | 330/286 X |
| 4,564,817 | 1/1986 | Gilson et al. | 330/286 |
| 4,595,881 | 6/1986 | Kennan | 330/54 |

FOREIGN PATENT DOCUMENTS

| | | |
|---|---|---|
| 0460562 | 2/1937 | United Kingdom . |
| 2143098 | 1/1985 | United Kingdom ............ 330/54 |
| 2143392 | 2/1985 | United Kingdom ............ 330/54 |

OTHER PUBLICATIONS

Kennan et al., "A 2-18 GHz Monolithic Distributed Amplifier Using Dual-Gate GaAs FET's";.
IEEE Trans. on MW Theory and Tech.s, (vol. MTT-32, No. 12; 12/84; p. 1693-1697).
Ayasli et al., "Capacitively Coupled Traveling Wave Power Amplifier"; IEEE Trans. on.
MW Theory and Tech.s, (vol. MTT-32, No. 12; 12/84; pp. 1704-1709).

*Primary Examiner*—Theodore M Blum
*Assistant Examiner*—Bernarr Earl Gregory
*Attorney, Agent, or Firm*—Robert J. Kraus

[57] ABSTRACT

An input signal for a travelling wave or distributed amplifier having input and output transmission lines is supplied to one end (1) of the input line and an output signal is derived from one end (4) of the output line. Conventionally, the other end (2, 3) of each line is terminated in a respective matched load, but three ports of the amplifier may be employed. The travelling wave amplifier may be used to replace a circulator (CIRC, FIG. 2) in an FMCW radar having a single transmitting/receiving antenna (ANT) (TWAMP1, FIG. 3), to replace a directional coupler (DC) for supplying a local oscillator signal to a mixer (MXR) (TWAMP2, FIG. 4), and in combination with a mixer diode (D) to form a mixer amplifier (TWAMP3, FIG. 3), giving the possibility of the larger-scale integration of RF circuits.

12 Claims, 2 Drawing Sheets

RF CIRCUIT ARRANGEMENT

This is a continuation of application Ser. No. 911,589 filed 9/25/86, now abandoned.

BACKGROUND OF THE INVENTION

The invention relates to an RF circuit arrangement comprising a travelling wave amplifier. The travelling wave amplifier comprises a succession of n amplifying devices, where $n \geq 2$, each having an input and an output, a first successiong of inductances connected in series with one another, and a second succession of inductances connected in series with one another. A respective input capacitance is associated with the input of each of the amplifying devices and a respective output capacitance is associated with the output of each of the amplifying devices. The inputs of the amplifying devices are coupled to the first succession of inductances at junctions thereof and the outputs of the amplifying devices are coupled to the second succession of inductances at junctions thereof. The travelling wave amplifier has an input transmission line comprising the first succession of inductances and the input capacitances associated with the amplifying devices and having two ends, and has an output transmission line comprising the second succession of inductances and the output capacitances associated with the amplifying devices and having two ends.

At each frequency in the operating frequency range of the amplifier, for each pair of successive amplifying devices, the phase delays for electromagnetic energy propagating respectively along the input transmission line and along the output transmission line, between the coupling to the inputs and the outputs respectively of the pair of successive amplifying devices, are substantially equal. The capacitance associated with capacitance of the amplifying device itself and/or a separate capacitor which may be of a lumped or distributed form.

The concept of a travelling wave (or distributed) amplifier to provide amplification of RF signals over a broad frequency range was originally proposed many years ago in GB No. 460 562; the amplifying devices of the original proposal were vacuum tubes. In recent years, there has been a considerable revival of interest in the proposal in order to provide amplification of microwave signals over a broad frequency range (for example as broad as 2-20 GHz) using Field Effect Transistors as the amplifying devices (see, for example, "Solid-State, Broadband Power Amplifiers for Electronic Warfare Applications" by T. A. Midford, Microwave Journal, February 1985, pages 95-116, and the references therein); this offers the possibility of integrating at least the travelling wave amplifier, and possibly a larger RF circuit arrangement comprising the amplifier, on a single substrate of semiconductor material.

SUMMARY OF THE INVENTION

According to the invention, an RF circuit arrangement comprising a travelling wave amplifier, as set forth in the opening paragraph, is characterized by the combination of signal-supply means and signal-utilizing means coupled respectively to one and the other end of one of the transmission lines, the signal-utilizing means utilizing in operation a signal propagating along the one transmission line from the signal-supply means.

In the conventional utilization of a travelling wave amplifier, an input signal is supplied to one end of the input transmission line and an output signal is taken from one end of the output transmission line; the other ends of the two lines are terminated in matched loads. The invention is based on the experimental determination of the fact that a not insubstantial signal may be derived at an end of either of the lines when a signal is supplied to the opposite end of the same time, and on the recognition that the amplifier can therefore be used as a 3-port device, an additional signal being supplied to the amplifier and/or an additional signal being derived from the amplifier at one end of a line that would previously simply have been terminated by a matched load; this enables the amplifier to be exploited in a wider range of applications than when used simply as a 2-port amplifier.

In a first form of RF circuit arrangement embodying the invention, the signal-supply means and the signal-utilizing means are coupled respectively to one and the other end of the input transmission line whereby the travelling wave amplifier supplies at one end of the output transmission line an amplifier version of an input signal derived from the signal-supply means and supplies a reduced version of the input signal to the signal-utilizing means at the other end of the input transmission line. In such a circuit arrangement, the travelling wave amplifier can effectively replace a directional coupler for application in which it is desired to couple out a sample of a signal travelling along a main transmission path, the sample being for example on the order of 10 dB below the signal in the main path. The "main transmission path" is the coupling between the one end of the input transmission line at which an input signal is derived from the signal-supply means and the one end of the output transmission line at which the amplified version of the input signal appears; the signal-utilizing means utilizes the sample (reduced version) of the input signal. A specific example of such an application is a transmitter/receiver wherein in operation the amplified version of the input signal is utilized for transmission and wherein the signal-utilizing means comprises a mixer for mixing the reduced version of the input signal with a signal derived from reception.

A second form of RF circuit arrangement embodying the invention comprises further a signal-supply means coupled to a first of the ends of the input transmission line for supplying an input signal to the travelling wave amplifier whereby in operation the travelling wave amplifier supplies at a first of the ends of the output transmission line an amplifier version of the input signal, wherein the signal-utilizing means are coupled to the second end of the output transmission line, and wherein there is coupled to the first end of the output transmission line means for utilizing the amplifier version of the input signal. A specific example of an application for such an arrangement is a transmitter/receiver wherein the means coupled to the first end of the output transmission line comprise an antenna for both transmitting and receiving, and wherein the signal-utilziing means comprises a mixer for mixing a signal derived from the antenna with a local-oscillator signal.

A third form of RF circuit arrangement embodying the invention comprises further signal-supply means coupled to a first of the ends of the input transmission line for supplying an input signal to the travelling wave amplifier whereby in operation the travelling wave amplifier supplies at a first of the ends of the output transmission line an amplified version of the input signal, wherein the signal-utilizing means is coupled to the first end of the output transmission line, whereby in operation the signal-utilizing means utilizes both the amplified version of the input signal and a signal derived from the signal-supply means coupled to the second end of the output transmission line. A specific example of an application for such an arrangement is a mixer circuit wherein the signal-utilizing means comprises a mixer diode, wherein the signal-supply means coupled to the second end of the output transmission line comprises means for generating a local-oscillator signal, and wherein the further signal-supply means coupled to the first end of the input transmission line comprises means for supplying a signal for frequency translation by the local-oscillator signal.

A transmitter/receiver comprising the first and/or second RF circuit arrangement may be embodied in a CW or low-power pulsed radar.

The amplifying devices may comprise Field Effect Transistors, wherein the source of each transistor is grounded, and wherein the input and output of each amplifying device comprises the gate and drain of the transistors. The RF circuit arrangement may then be formed substantially on a single substrate of semiconductor material.

BRIEF DESCRIPTION OF THE DRAWING

Embodiments of the invention will now be described, by way of example, with reference to the diagrammatic drawing, in which.

DESCRIPTION OF THE PREFERRED EMBODIMENTS

Figure 1:
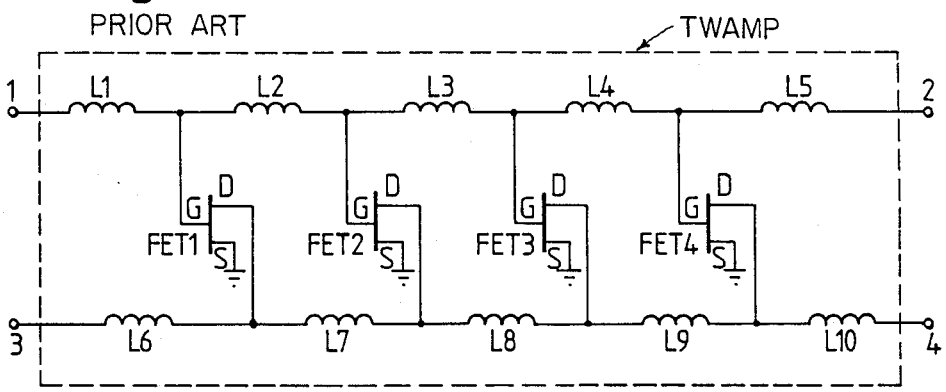
FIG. 1 is a schematic diagram of a travelling wave amplifier.

FIG. 1 is a simplified schematic diagram of a travelling wave amplifier. The amplifier comprises a succession of amplifying devices, in this instance four devices each comprising a single Field Effect Transistor FET-1–FET4, respectively. The amplifier further comprises a first succession of inductances in series, L1–L5, and a second succession of inducatnces in series, L6–L10. The gate G of each FET constitutes the input of the respective amplifying device and the drain D its output. Each amplifying device has associated therewith input capacitance, predominantly the capacitance between the gate G and source S of the FET, and output capacitance, predominantly the capacitance between the drain D and source S of FET, the source S being earthed. The inputs of the amplifying devices are coupled (in this case directly connected) to the first succession of inductances L1–L5 at junctions between each two successive inductances, and the outputs of the amplifying devices are similarly coupled to the second succession of inductances L6–L10. The travelling wave amplifier thus has an input transmission line comprising the first succession of inductances L1–L5 and the input capacitance associated with the amplifying devices, and has an output transmission line comprising the second succession of inductances L6–L10 and the output capcitances associated with the amplifying devices. Suitable bias voltages are applied to the FETs (by means not shown). An RF voltage applied to a port that comprises one end of the first succession of inductances and earth (not shown), for example at the port designated 1, results in a signal travelling along the input transmission line and being coupled successively to the inputs of the amplifying device. Resultant signals appearing at the outputs of the amplifying devices produce signals travelling in each direction along the output transmission line. The arrangement is such that the signals travelling along the output transmission line in the same sense as the signals travelling along the input transmission line interfere construtively. That is the signals traveling along the output transmission line in the same sense as the signals travelling along the input transmission line from port 1 which are coupled to the amplifying devices, interfere constructively to produce a net output signal at one end of the output transmission line (in this instance at the port designated 4). Conversely, the signals travelling along the output transmission line in the opposite sense interfere destructively.

Suitably,

L1=L5 and

L2=L3=L4=2(L1) and similarly,

L6=L10 and

L7=L8=L9=2(L6).

The respective characteristic impedances of the input and output transmission lines are suitably substantially equal. To obtain equal phase velocities along the two lines over a substantial range of frequencies,

L2=L7.

Since the drain-source capacitance of a FET is generally less than its gate-source capacitance, an additional respective capacitor (not shown) may be added in shunt with the drain of each FET to equalize the capacitances of the input and output transmission lines respectively associated with each amplifying device. Alternatively, additional respective capacitors (not shown) may be added in shunt with the gate and with the drain of one or more of the FETs to form transmission lines with desired charactersitics.

The transistors FET1–FET4 may be discrete devices supported on a substrate of dielectric material or may be formed integrally on a single substrate of semiconductor material. The two successions of inductances may each comprise a series of narrow strip conductors on one major surface of the substrate that in combination with a ground plane on the opposite major surface form respective microstrip lines of relatively high impedance.

Conventionally, the two ports respectively comprising the other end of the input transmission line and of the output transmission line, designated 2 and 3 respectively in FIG. 1, are terminated with resistive loads matched to the characteristic impedances of the two lines. However, the applicants have found that when a signal is supplied to one end of either of the lines, a signal of significant relative magnitude may be derived from the other end of the same line, and have appreciated that this enables at least three ports of the amplifier to be used. Such use broadens the range of applications of travelling wave amplifiers, and is particularly suitable for enabling the larger-scale integration of RF circuits by employing a travelling wave amplifier in place of a previously discrete circuit component.

Figure 2:
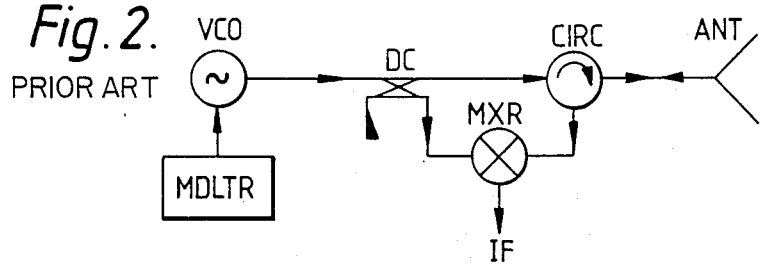
FIG. 2 is a block diagram of a conventional FMCW radar.

A first example of such employment is to replace a circulator in a CW radar. FIG. 2 is a block diagram of a conventional FMCW radar, comprising a modulator MDLTR which provides a swept output voltage to vary the output frequency of a voltage controlled oscillator VCO, a directional coupler DC, a circulator CIRC, a single antenna ANT, and a mixer MXR. The single antenna is used both for transmitting a signal and for receiving reflected echo signals from targets (rather than using respective antennae for these two functions, for example for the sake of compactness). The circulator is necessary to separate the transmitted and received signals. The mixer combines an echo signal from a target with a local oscillator signal derived from the oscillator VCO via the directional coupler DC to produce an intermediate frequency signal IF whose frequency is representative of the distance of the target from the radar (assuming the distance not to be changing).

Figure 3:
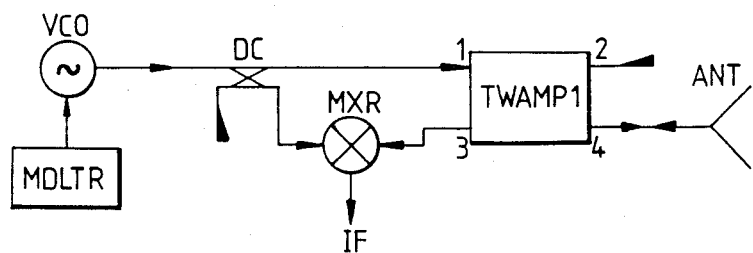
FIGS. 3 and 4 are respective block diagrams of FMCW radars embodying the invention.

FIG. 3 shows how a first travelling wave amplifier TWAMP1 may be used to replace the circulator in the radar of FIG. 2. For simplicity, the travelling wave amplifier is indicated as a circuit block with four ports numbered 1-4 respectively; ports 1 and 2 are at the ends of the input transmission line, and porst 3 and 4 are at the ends of the output transmission line, so that a signal applied to port 1 results in an amplified version of the signal appearing at port 4, as in the amplifier of FIG. 1. The major proportion of the signal from the oscillator VCO is supplied via the directional coupler DC to port 1 of the amplifier, and the antenna ANT is connected to port 4. Port 2 is as usual terminated in a matched load. Port 3, instead of being terminated in a matched load, is connected to the RF signal input of the mixer MXR. In operation, echo signals received by the antenna are coupled back along the output transmission line from port 4 to port 3 of the amplifier with attenuation, but this attenuation is in general (depending on the gain of the amplifier at the operating frequency) more than compensated for by the amplification provided by the travelling wave amplifier of the transmitted signal from which the echo results. Thus in this circuit arrangement, the antenna which is coupled to port 4 of the amplifier consitutes both means for utilizing the amplified version of the input signal which is supplied to port 1 of the amplifier (by radiating this amplified signal) and signal-supply means (supplying a received echo signal to port 4), and the mixer which is coupled to port 3 constitutes signal-utilizing means which in operation utilize the signal derived along the output transmission line from the signal supply means (the antenna).

Figure 4:
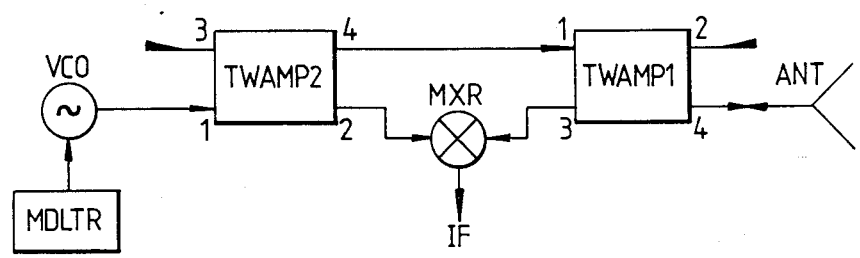

FIG. 4 shows a modification of the RF circuit arrangement of FIG. 3 in which a further travelling wave amplifier TWAMP2 is employed to replace the directional coupler. Port 1 of TWAMP2 is supplied by the oscillator VCO, and port 4 is connected to port 1 of TWAMP1; port 3 is as usual terminated in a matched load, and port 2, instead of being terminated in a matched load, is connected to the local-oscillator input of the mixer MXR. In operation, an input signal supplied to port 1 of TWAMP2 from the oscillator VCO propagates along the input transmission line to port 2, with attenuation, to be utilized by the mixer, while an amplified version of the input signal appearing at port 4 passes to TWAMP1 and thence after further amplification therein to the antenna to be radiated. The use of a travelling wave amplifier in place of a directional cojupler may have the advantage of greater compactness (especially at fairly low frequencies), which may be particularly desirable where an RF circuit arrangement is to be formed on a single substrate of semiconductor material. If desired, a further RF amplifier may be provided in the transmission path between port 3 of TWAMP1 and the RF signal input of the mixer MXR; this amplifier may conveniently be integrated on the same substrate.

Figure 5:
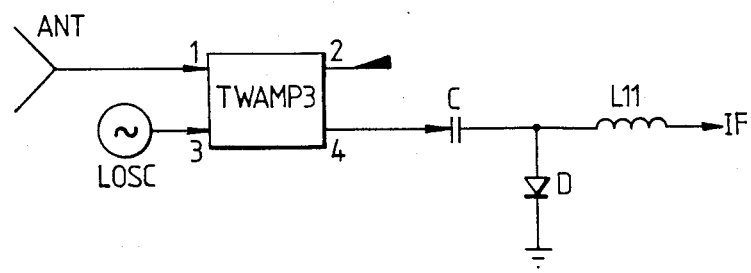
FIG. 5 is a schematic diagram of a mixer embodying the invention.

FIG. 5 shows another embodiment of the invention in which a travelling wave amplifier TWAMP3 is used in combination with a mixer diode D to form a mixer amplifier. An RF signal whose frequency is to be translated is supplied to port 1 of the amplifier,k and a local oscillator signal LO is supplied to port 3; in this case, the RF signal is depicted as being supplied by an antenna ANT and the local oscillator signal by a specific local oscillator LOSC. The local oscillator signal could as an alternative be derived from an oscillator used for an additional purpose, as in the radar systems of FIGS. 2-4. The mixer diode D is coupled to port 4 via a capacitor C which provides DC isolation of the diode from bias voltages applied to the amplifying devices in the amplifier, and port 2 is terminated in a matched load. The mixer diode thus utilizes both an amplified version of the RF signal applied to port 1 and an attenuated version of the LO signal supplied to port 3 that emerges from port 4 after propagation along the output transmission line of the amplifier. An intermediate frequency signal IF is extracted from the mixer diode via a low-pass filter, in this instance a series inductance L11 of magnitude much greater than the inductances of the amplifier input and ouput lines. Suitably, the diode is biased (by means not shown) to present an impedance approximating the characteristic impedance of the output transmission line.

An amplifying device in the travelling wave amplifier of an RF circuit arrangement embodying the invention may for example comprise two FETs in parallel, or may itself be a distributed amplifier, as disclosed in GB No. 2 143 098 A.

I claim:
1. A multiport RF circuit arrangement comprising:
  (a) a first plurality of inductors electrically connected in series between a first terminal and a second terminal;
  (b) a second plurality of inductors electrically connected in series between a third terminal and a fourth terminal;
  (c) a plurality of amplifier devices each having an input coupled to a respective junction between a pair of the first plurality of inductors and having an output coupled to a respective junction between a corresponding pair of the second plurality of inductors, said devices having associated therewith respective input capacitances for cooperating with the first plurality of inductors to form an input transmission line and having associated therewith respective output capacitances for cooperating with the second plurality of inductors to form an output transmission line, said input and output transmission lines providing substantially equal phase delays for signals having frequencies in an operating frequency range of the circuit arrangement;
  (d) signal supply means coupled to the first terminal;
  (e) signal utilization means coupled to the fourth terminal for receiving an amplified version of a signal provided by the signal supply means;
  (f) signal supply/utilization means coupled to one of the second and third terminals for signals propagating through the respective transmission line; and
  (g) a terminating impedance coupled to the other one of the second and third terminals.

2. A circuit arrangement as in claim 1 where the signal supply/utilization means is coupled to the second terminal.

3. A circuit arrangement as in claim 2 where the signal supply/utilization means comprises a signal utilization means.

4. A circuit arrangement as in claim 1 where the signal supply/utilization means is coupled to the third terminal.

5. A circuit arrangement as in claim 4 where the signal supply/utilization means comprises a signal utilization means.

6. A circuit arrangement as in claim 5 where the signal utilization means coupled to the fourth terminal is adapted to both receive signals from the fourth terminal and to apply signals to the fourth terminal.

7. A circuit arrangement as in claim 6 where the signal utilization means coupled to the fourth terminal comprises an antenna.

8. A circuit arrangement as in claim 7 comprising a radar apparatus.

9. A circuit arrangement as in cliam 7 where the signal supply/utilization means comprises a signal supply means.

10. A circuit arrangement as in claim 9, said arrangement functioning as mixer amplifier.

11. A multiport RF circuit arrangement comprising:
(a) a circulator including:
  (1) a first plurality of inductors electrically connected in series between a first terminal and a second terminal;
  (2) a second plurality of inductors electrically connected in series between a third terminal and a fourth terminal; and
  (3) a plurality of amplifier devices each having an input coupled to a respective junction between a pair of the first plurality of inductors and having an output coupled to a respective junction between a corresponding pair of the second plurality of inductors, said devices having associated therewith respective input capacitances for cooperating with the first plurality of inductors to form an input transmission line and having associated therewith respective output capacitances for cooperating with the second plurality of inductors to form an output transmission line, said input and output transmission lines providing substantially equal phase delays for signals having frequencies in an operating frequency range of the circuit arrangement;
(b) signal supply means coupled to the first terminal;
(c) a transmitting/receiving antenna coupled to the fourth terminal;
(d) signal utilization means coupled to the third terminal; and
(e) a terminating impedance coupled to the second terminal.

12. A multiport RF circuit arrangement comprising:
(a) a directional coupled including:
  (1) a first plurality of inductors electrically connected in series between a first terminal and a second terminal;
  (2) a second plurality of inductors electrically connected in series between a third terminal and a fourth terminal; and
  (3) a plurality of amplifier devices each having an input coupled to a respective junction between a pair of the first plurality of inductors and having an output coupled to a respective junction between a corresponding pair of the second plurality of inductors, said devices having associated therewith respective input capacitances for cooperating with the first plurality of inductors to form an input transmission line and having associated therewith respective output capacitances for cooperating with the second plurality of inductors to form an output transmission line, said input and output transmission lines providing substantially equal phase delays for signals having frequencies in an operating frequency range of the circuit arrangement;
(b) signal supply means coupled to the first terminal;
(c) signal utilization means coupled to the fourth terminal for receiving an amplified version of a signal provided by the signal supply means;
(d) signal utilization means coupled to the second terminal; and
(e) a terminating impedance coupled to the third terminal.

* * * * *